US006879200B2

(12) United States Patent
Komura et al.

(10) Patent No.: US 6,879,200 B2
(45) Date of Patent: Apr. 12, 2005

(54) DELAY CIRCUIT, SEMICONDUCTOR INTEGRATED CIRCUIT DEVICE CONTAINING A DELAY CIRCUIT AND DELAY METHOD

(75) Inventors: Kazufumi Komura, Kasugai (JP); Satoru Kawamoto, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/921,561

(22) Filed: Aug. 6, 2001

(65) Prior Publication Data

US 2002/0140484 A1 Oct. 3, 2002

(30) Foreign Application Priority Data

Mar. 28, 2001 (JP) ........................................ 2001-092892

(51) Int. Cl.[7] .............................................. H03H 11/26
(52) U.S. Cl. ...................... 327/278; 327/272; 327/284
(58) Field of Search ................................ 327/261–264, 327/269–278, 281–285, 158, 161, 149, 182, 183, 374, 376–377, 403, 404, 407, 408, 170, 355; 375/371, 354, 377; 365/194, 233, 233.5; 713/400, 401

(56) References Cited

U.S. PATENT DOCUMENTS

| 5,355,037 | A | * | 10/1994 | Andresen et al. ............ 327/158 |
| 5,521,540 | A | * | 5/1996 | Marbot ....................... 327/170 |
| 5,778,214 | A | * | 7/1998 | Taya et al. .................. 713/400 |
| 6,111,447 | A | | 8/2000 | Ternullo, Jr. ................ 327/292 |
| 6,175,605 | B1 | * | 1/2001 | Chi ............................. 327/161 |
| 6,437,618 | B2 | * | 8/2002 | Lee ............................. 327/158 |

FOREIGN PATENT DOCUMENTS

| CN | 427069 | 3/2001 |
| JP | 10-149227 | 6/1998 |

* cited by examiner

Primary Examiner—Minh Nguyen
(74) Attorney, Agent, or Firm—Arent Fox PLLC

(57) ABSTRACT

A delay circuit including a delay section having two or more predetermined delay stages is disclosed. Each predetermined delay stage adds a predetermined delay time to an input signal. The delay circuit also includes selecting switch sections. At least one of the selecting switch sections includes: a buffer section for receiving a delayed input signal from one of the delay stages and a selecting section means directly connected to the buffer section for activating the buffer section to establish a delay path, wherein an output signal from the delay path has a desired delay time.

7 Claims, 10 Drawing Sheets

DELAY CIRCUIT ACCORDING TO THE SIXTH EMBODIMENT

FIG.1 DELAY CIRCUIT ACCORDING TO THE FIRST EMBODIMENT

FIG.2 DELAY CIRCUIT ACCORDING TO THE SECOND EMBODIMENT

FIG.3 DELAY CIRCUIT ACCORDING TO THE THIRD EMBODIMENT

FIG.4 DELAY CIRCUIT ACCORDING TO THE FOURTH EMBODIMENT

FIG.5 DELAY CIRCUIT ACCORDING TO THE FIFTH EMBODIMENT

FIG.6 DELAY CIRCUIT ACCORDING TO THE SIXTH EMBODIMENT

FIG.7 DELAY CIRCUIT ACCORDING TO THE SEVENTH EMBODIMENT

FIRST DELAY CIRCUIT OF THE FIRST RELATED TECHNOLOGY

SECOND DELAY CIRCUIT OF THE SECOND RELATED TECHNOLOGY

THIRD DELAY CIRCUIT OF THE THIRD RELATED TECHNOLOGY

US 6,879,200 B2

DELAY CIRCUIT, SEMICONDUCTOR INTEGRATED CIRCUIT DEVICE CONTAINING A DELAY CIRCUIT AND DELAY METHOD

BACKGROUND OF THE INVENTION

1. Field of the Invention

The present invention relates to a delay circuit, a semiconductor integrated circuit device containing a delay circuit and a delay method that enable signal propagation delay time to be adjusted in a semiconductor integrated circuit device without being affected by parasitic elements.

2. Description of the Related Art

Recent years have seen even further progress in the increasing speed of semiconductor integrated circuit devices. Due to the increased speed of the CPU and system LSI and the like, the operational leeway in the mutual transition timing between signals in the internal critical paths has become extremely short and the adjustment time steps and the adjustment accuracy of the delay circuit for the timing adjustment are becoming more and more exacting. Moreover, as a result of the increasing speed of the CPU and system LSI etc., there is also a need for a synchronous semiconductor memory device such as is typified by synchronous random access memory (referred to below as SDRAM) that operates at a high speed operating frequency of 200 MHz or more. In order to retain the phase lock as the speed of the external clock, which is a synchronized signal, increases, there is a need for a delay circuit capable of accurately adjusting the phase in extremely small time steps. Three related technologies are given below as responses to this requirement. Note that, for convenience, the number of delay steps in the descriptions below is given as four.

A delay circuit 1000 of the first related technology is shown in FIG. 8. The delay circuit 1000 shown in FIG. 8 is formed from a delay section 100 into which an input signal IN is input; selecting switch sections SW110, SW210, SW310, and SW410 for selecting one from among the four delayed output signals N10, N20, N30, and N40 each of which has a different amount of delay from the delay section 100; and an output buffer circuit 500 connected to the selecting switches SW110 through SW410 for outputting delayed signals as an output signal OUT.

The delay section 100 is formed from two stage inverter gates 101 and 102, 201 and 202, 301 and 302, and 401 and 402. The delay section 100 is structured such that a delayed output signal to which a sequential unit delay time is added at each two stage inverter gates (serving as a predetermined delay step for generating a unit delay time) is obtained. Namely, the output of the input signal IN after the two stage inverter gates 101 and 102 becomes the delayed output signal N10. Thereafter, the output from the two stage inverter gates 201 and 202 into which the delayed output signal N10 is input becomes the delayed output signal N20. The output from the two stage inverter gates 301 and 302 into which the delayed output signal N20 is input becomes the delayed output signal N30. Lastly, the output from the two stage inverter gates 401 and 402 into which the delayed output signal N30 is input becomes the delayed output signal N40. Thus four delayed output signals N10 through N40 comprising the sequentially added unit delay times are output. These delayed output signals N10 through N40 are input respectively into the selecting switch circuits SW110 through SW410. The selecting switch circuits SW110 through SW410 are provided with transfer gates for connecting the delayed output signals N10 to N40 to the output buffer circuit 500. The transfer gates are structured such that source terminals and drain terminals of PMOS and NMOS transistors are mutually connected together and drain terminals of PMOS and NMOS transistors are mutually connected together (T110 and T120, T210 and T220, T310 and T320, and T410 and T420). In addition, only the corresponding transfer gate is conducted to the gate terminal by selecting one from among the control signals /S(0,0), /S(1,0), /S(0,1), and /S(1,1) whose logic level is at a low level, and a predetermined delayed output signal (one from among N10 through N40) is connected to the output buffer circuit 500 and an output signal OUT having a predetermined delay time is output. Here, the NMOS transistor is conducted when a high level signal is input to the gate terminal, the output signals from the inverter gates INV110, INV210, INV310, and INV410 that invert the logic of the control signals /S(0,0) through /S(1,1) are input. The output buffer circuit 500 shapes the waveforms of the signals from the transfer gates and also ensures the performance of the driving of the output signal OUT that is input into an unillustrated later stage circuit. The output buffer circuit 500 is formed from two stage inverter gates 501 and 502, as is shown in FIG. 8.

Using this circuit structure, if the delay time of the signal propagation in the two stage inverter gates 101 and 102 through 401 and 402 is taken as the unit delay time, for the input signal IN, the delay circuit 1000 outputs as the output signal OUT a delayed signal that has this unit delay time as the delay step.

In a delay circuit 2000 of the second related technology shown in FIG. 9, instead of the selecting switch circuits SW110 through SW410 of the first delay circuit 1000 of the related technology, the selecting switch circuits SW120, SW220, SW320, and SW420 are provided. In the selecting switch circuits SW120 through SW420, a logic operation is performed on the delayed output signals N10 through N40 with the control signals /S(0,0) through /S(1,1) and they are then output to the output buffer circuit 503. Namely, the selecting switch circuits SW120 through SW420 output the logic operation result obtained when the delayed output signals N10 through N40 from the delay section 100 are input together with the control signals /S(0,0) through /S(1,1) into the NOR gates NOR 10, NOR210, NOR310, and NOR410. When a control signal /S(0,0) through /S(1,1) is selected and the level thereof becomes low, one of the inputs of the corresponding NOR gate NOR110 through NOR410 becomes low level and performs the inversion logic operation. The other control signals /S(0,0) through /S(1,1) become high level and each one of the inputs of the NOR gates NOR110 through NOR410 not selected becomes high level, and the outputs are fixed at low level. Only the output signal N11, N21, N31, or N41 of the selected selecting switch circuit SW120 through SW420 becomes the inverted signal of the delayed output signals N10 through N40 and the other output signals are fixed at low level. Accordingly, by performing a logic operation on the output signals N11 through N41 using the four input NOR gate 503, which is an output buffer circuit, they undergo a logic inversion and are output as the output signal OUT.

As a result of this circuit structure, if the delay time of the signal propagation in the two stage inverter gates 101 and 102 through 401 and 402 is taken as the unit delay time, for the input signal IN, the delay circuit 2000 outputs as the output signal OUT a delayed signal that has this unit delay time as the delay step.

A delay circuit 3000 of the third related technology shown in FIG. 10 is a circuit that is disclosed in, for example, FIG.

9 of Japanese Laid-Open Patent Publication No. 10-149227. This delay circuit 3000 differs from the delay circuit 1000 of the first related technology and the delay circuit 2000 of the second related technology in that it has a structure in which, after the input signal IN has been inverted by an inverter gate 800, it is split by selecting switch circuits SW130, SW230, SW330, and SW430 and input into the respective predetermined delay stages of the delay section 110. A predetermined delay signal is then output from the termination of the delay section 110 as the output signal OUT. Instead of the prior stage inverter gates 101, 201, 301, and 401 in the predetermined delay stage of the delay section 100, the predetermined delay stage of the delay section 110 is formed from NAND gates 103, 203, 303, and 403. The input into the NAND gate 103 at the head of the delay chain is connected to the output N12 from the selecting switch circuit SW130 and is also connected to the power supply voltage Vcc. In addition, each one of the inputs of each of the NAND gates 203, 303, and 403 is connected to the output from a predetermined delay stage from the previous stage, respectively, and the relevant output N22 through N42 from the relevant selecting switch circuit SW230 through SW430 is connected to the other input. When a signal from the control signals /S(0,0) through /S(1,1) inverted via inverter gates INV16 through INV46 becomes high level, one of the inputs of the corresponding NAND gate NAND110 through NAND410 becomes high level and performs the inversion logic operation. When the other control signals /S(0,0) through /S(1,1) become high level, each one of the inputs of the NAND gates NAND110 through NAND410 becomes low level and the outputs are fixed at high level. A signal that is in phase with the input signal IN is conveyed only to one of the output signals N12 through N42 of the selected selecting switch circuits SW130 through SW430 and the other output signals are fixed at high level. Because the input gates of the predetermined delay stages into which the signals N12 through N42 are input are also the NAND gates N103 through N403, one of the NAND gates 103 through 403 into which a high level is input actually performs the inversion logic operation. Because the power supply voltage Vcc is input into the NAND gate 103 at the head of the delay chain, a high level is output by each predetermined delay stage that receives a high level fixed signal from the non-selected selecting switch circuit continuing on from the head of the delay chain. The predetermined delay stage is composed of the NAND gate, that performs inversion processing on the high level input and the inverter gate. Accordingly, downstream from the predetermined delay stage that receives the signal from the selecting switch circuit that is selected and outputs a signal in-phase with the input signal, the unit delay time is sequentially added to this in-phase signal and is propagated.

As a result of this circuit structure, if the delay time of the signal propagation of the NAND gate and the inverter gate is taken as the unit delay time, for the input signal IN, the delay circuit 3000 outputs as the output signal OUT a delay signal that has this unit delay time as the delay step.

However, in the delay circuit 1000 of the first related technology, because the delay section 100 and the output buffer circuit 500 are connected via the transfer gates, ON resistances of the PMOS and NMOS transistors T110 and T120 through T410 and T420 forming the transfer gates are inserted into the signal path as parasitic resistance. This parasitic resistance has a small value if the size of the transistors forming the transfer gate is enlarged, however, in a semiconductor integrated circuit device, it is normal for the delay circuit 100 to have a multi stage structure because a substantial adjustable range span is necessary. For example, a DLL circuit used in SDRAM or the like is formed from 100 or more predetermined delay stages. In addition, because the area on a chip allocated to be taken up by the delay circuit 1000 is limited, it is not possible to make the size of the transistor sufficiently large. Therefore, it is quite common for this parasitic resistance to attain a comparatively large value and to attain a value of approximately 100 ohms. Moreover, the output terminals of all the selecting switch circuits SW110 through SW410 are all joined together as the terminal N100 and, in addition to the wiring capacitance and input gate capacitance of the output buffer circuit 500, the junction capacitance of the source and the drain of the PMOS and NMOS transistors T110 and T120 through T410 and T420 forming the transfer gates at the outputs of each of the selecting switch circuits SW110 through SW410 are also connected. Therefore, a large capacitance load is present as a parasitic capacitance at the terminal N100 and it is common for a parasitic capacitance of approximately 10 pF to be present depending on the number of predetermined delay stages. Accordingly, a parasitic CR time constant circuit is formed due to the load of the above parasitic resistance and parasitic capacitance in the signal path from the output of each predetermined delay stage of the delay section 100 to the output buffer circuit 500 so that not only is a signal propagation delay generated, but the signal waveform itself rounds. Moreover, because the parasitic resistance and capacitance vary widely due to inconsistencies in the manufacturing of the semiconductor integrated circuit devices, the delay amount and the like of these parasitic elements are also varied. If the time constant of this parasitic delay circuit is calculated from the above numerical example, it is approximately 1 nsec. Because this is a time that is approximately ten times the size of the unit delay time, a delay from the parasitic element of approximately ten times the adjustment value of the delay time is added to the adjustment value of the unit delay time causing the problem that it is not possible to accurately adjust the delay amount. In particular, as adjustment of the delay amount in more minute time step will henceforth be required in response to the ever increasing speed of semiconductor integrated circuit devices, it is going to be difficult to accurately perform the delay adjustment. Moreover, circuit operation is necessary in short pulses, however, the concern exists that the short pulses will become flattened and disappear due to the rounding of the waveform caused by the parasitic delay elements. In this case, the problem arises that the semiconductor integrated circuit device might cause operational malfunctions.

The rounding and the like of the signal waveform caused by the parasitic CR time constant circuit can be improved by increasing the drive capacity of the output inverter gates 102 through 402 of each of the predetermined delay stages of the delay section 100 driving the terminal N100 from the terminals N10 through N40, which is the signal path. However, the problem with this is that while the delay—rounding effect caused by the parasitic elements becomes greater the more stages there are in the delay section 100, the increase in the drive capacity of the inverter gates 102 through 402 becomes limited by the restrictions of the allowable surface area on the chip, creating the concern that it will become even more difficult to respond to the demands for adjustment of the delay amount in even more minute time step to go with the increased speeds of the semiconductor integrated circuit devices.

In the delay circuit 2000 of the second related technology, because the outputs from the selecting switch circuits SW120 through SW420 are from the NOR gates NOR110 through NOR410, terminals N11 through N41, which are individual signal paths, are connected to each of the selecting switch circuits SW120 through SW420. Therefore, in the delay circuit 2000 having a multi stage structure, because more of the terminals N11 through N41 are needed and a large area is required for the wiring on the chip surface, the problem arises that the further integration of the semiconductor integrated circuit device is held back. In addition, a predetermined logic circuit is also required as the output buffer circuit in order for a delay signal selected from these signals for the input signal IN to be output to the output terminal OUT. In FIG. 9, a four input NOR gate NOR503 is used as an example of an output buffer circuit for performing the logic operation on the four signals N11 through N41. However, because the dimensions of the logic circuit become more complex as the more terminals N11 through N41 are needed as signal paths in the multi stage structure delay circuit 2000 requiring a large area of the chip surface, the problem arises that the further integration of the semiconductor integrated circuit device is held back.

In a delay circuit 3000 of the third related technology, the output terminal N800 of the inverter gate 800 for inverting the input signal IN is connected all of the NAND gates NAND110 through NAND410 forming the selecting switch circuits SW130 through SW430. Because the number of the NAND gates that need to be connected to the output terminal N800 of the inverter gate 800 is proportional to the number of predetermined delay stages, the gate capacitance of the terminal N800 that needs to be driven by the inverter gate 800 increases as the structure of the delay circuit 3000 becomes more multi staged. Accordingly, the problem arises in the delay circuit 3000 having a multi stage structure that, as a result of the drive capacity of the inverter gate 800 becoming more and more insufficient as the capacitance load of the terminal N800 increases, the possibility exists that short pulse waveform will become ragged.

Moreover, in each predetermined delay stage in the delay section 110, while the latter stage gates are the inverter gates 102 through 402, the former stage gates are formed from the NAND gates 103 through 403. Here, because the structure of the transistors in each gate relating to the output terminal is a balanced symmetrical placement between the power supply voltage Vcc side and the ground potential Vss side in the case of the inverter gate, there is no difference between the drive capacity of the source and sink drives. However, in the case of the NAND gate, while the PMOS transistors are connected in parallel on the power supply voltage Vcc side, on the ground potential Vss side, the NMOS transistors are connected in series. Therefore, the drive capacity is unbalanced because the drive capacity of the sink drive is weaker than the drive capacity of the source drive. Namely, when a pulse waveform is applied to the input signal IN, the fall waveform becomes rounder compared with the rise waveform of the output of the NAND gate 103 through 403. This shows that a larger delay is generated corresponding to the rise waveform compared with the fall waveform of the input signal IN, and indicates that the propagated pulse width becomes narrower each time it passes through a predetermined delay stage. The problem is thus that the possibility exists that the short pulse propagation needed as the speed of the semiconductor integrated circuit device increases may not be obtainable.

Each of the above problems may be improved to a certain extent by increasing the drive capacity of the inverter gate 800 or by increasing the size of the NMOS transistors connected in series on the ground potential Vss side of the NAND gates 103 through 403. However, such measures create the problem that they require a large portion of the chip surface area thereby preventing further advances in the level of integration of the semiconductor integrated circuit device. In addition, any increase in the size of the transistor in itself means that there is an increase in the parasitic capacitance and gives rise to the problem that a greater number of stages in the structure of the delay circuit 3000 and faster operation are not able to be achieved.

SUMMARY OF THE INVENTION

The present invention was conceived in order to solve the above problems in the related technology and it is an object thereof to provide a delay circuit, a semiconductor integrated circuit device containing the delay circuit, and a delay method, that enable a delay signal having a predetermined delay time and a delay pulse having a predetermined time width to be accurately and appropriately generated by accurately adding a delay time where appropriate to a propagated signal from the input of the signal without causing any waveform deformation or parasitic delay caused by parasitic elements.

In order to achieve the above objects, the delay circuit according to one aspect of the present invention comprises: a delay section having two or more predetermined delay stages in which predetermined delay time is added to an input signal; and selecting switch sections for combining the predetermined delay stages as appropriate and establishing a delay path for the input signal that outputs a delayed output signal having the desired delay time, wherein the selecting switch sections comprise: buffer sections for inputting propagated signals from the input signal; and selecting section means for activating the buffer sections when the delay path is being established in the delay section.

Further, in order to achieve the above objects, the semiconductor integrated circuit device according to another aspect of the present invention comprises: a delay section having two or more predetermined delay stages in which predetermined delay time is added to an input signal; buffer sections for inputting propagated signals from the input signal; and selecting section means for establishing a delay path in the delay section; wherein the selecting switch sections combine the predetermined delay stages as appropriate and establish a delay path for the input signal that outputs a delayed output signal having the desired delay time.

Further, in order to achieve the above objects, the delay method according to another aspect of the present invention comprises: a delay step in which predetermined delay times are sequentially added onto an input signal; an output step in which delay signals are output for each predetermined delay time added in the delay step; and a selecting step which is only activated when a delay signal having the desired delay time is output in the output step.

In this delay circuit, semiconductor integrated circuit device, and delay method a propagated signal from a delay section having two or more predetermined delay stages is received by the buffer section of a selecting switch section, and the buffer section is activated by a selecting section so as to establish a delay path in which these predetermined delay stages are combined in an appropriate manner such that a delayed signal having the desired delay time is output.

Consequently, if the buffer section into which a propagated signal is input from the delay section is activated where appropriate by the selecting section means, it becomes possible to establish a delay path that has the desired delay time. Therefore, it is possible to select a path without having to insert parasitic loads such as transfer gates and the like onto the delay path. Moreover, because it is possible using this circuit structure to keep the effects on the delay time of the parasitic load of the elements to the minimum, it is possible for the circuit to be formed with a compact element size that does not cause any problems with the amount of the surface area of the chip that it occupies. Accordingly, no parasitic delay circuit such as a CR time constant circuit or the like is inserted on the delay path formed from the delay section via the selecting switch sections and there is no rounding of the signal waveform itself or signal propagation delay based on this circuit. In addition, even when the circuit is operating in short pulses, it is possible to accurately maintain the short pulses without the pulses becoming squashed. It is even possible to suppress any variations in the delay amount caused by inconsistencies in the production of the semiconductor integrated circuit device and the like. In particular, even when the delay amount needs to be adjusted in minute time steps or when the input needs to be in short pulses to match the advancing speed of the semiconductor integrated circuit device, it is possible to provide a delay circuit that is capable of performing the delay adjustment with a high degree of accuracy.

Furthermore, even though the delay circuit allows the appropriate delay time for a variety of purposes to be selected, the area of the chip occupied by the delay circuit can be held to a compact size thus making a major contribution to further increased integration in semiconductor integrated circuit devices.

Moreover, because there is no need to perform a logic operation on propagated signals that have different delay times from the delay section and then select the appropriate ones, there is no longer any need for the large wiring space needed for the placement of a large number of wires for each propagated signal. Nor is there any need for complex or large scale logic circuits for selecting the appropriate signal from among a multitude of propagated signals. Accordingly, it is possible for the area on the chip occupied by the delay circuit to be kept small thus further contributing to increased integration in semiconductor integrated circuit devices.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF PREFERRED EMBODIMENTS

Specific embodiments of the delay circuit, semiconductor integrated circuit device containing the delay circuit, and the delay method of the present invention will now be described in detail with reference to the drawings.

Figure 1:
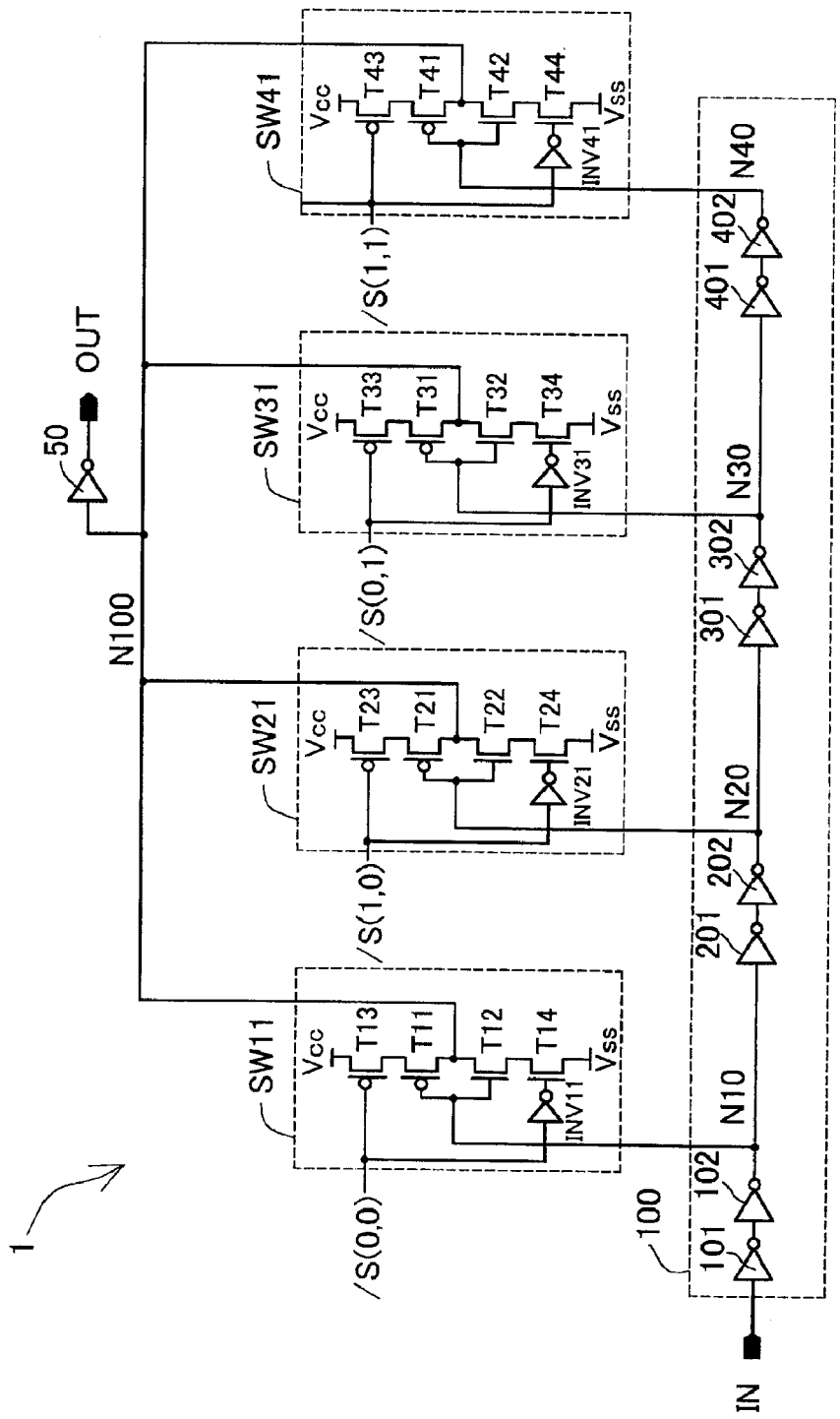
FIG. 1 is a circuit diagram showing the delay circuit according to a first embodiment.
Figure 8:
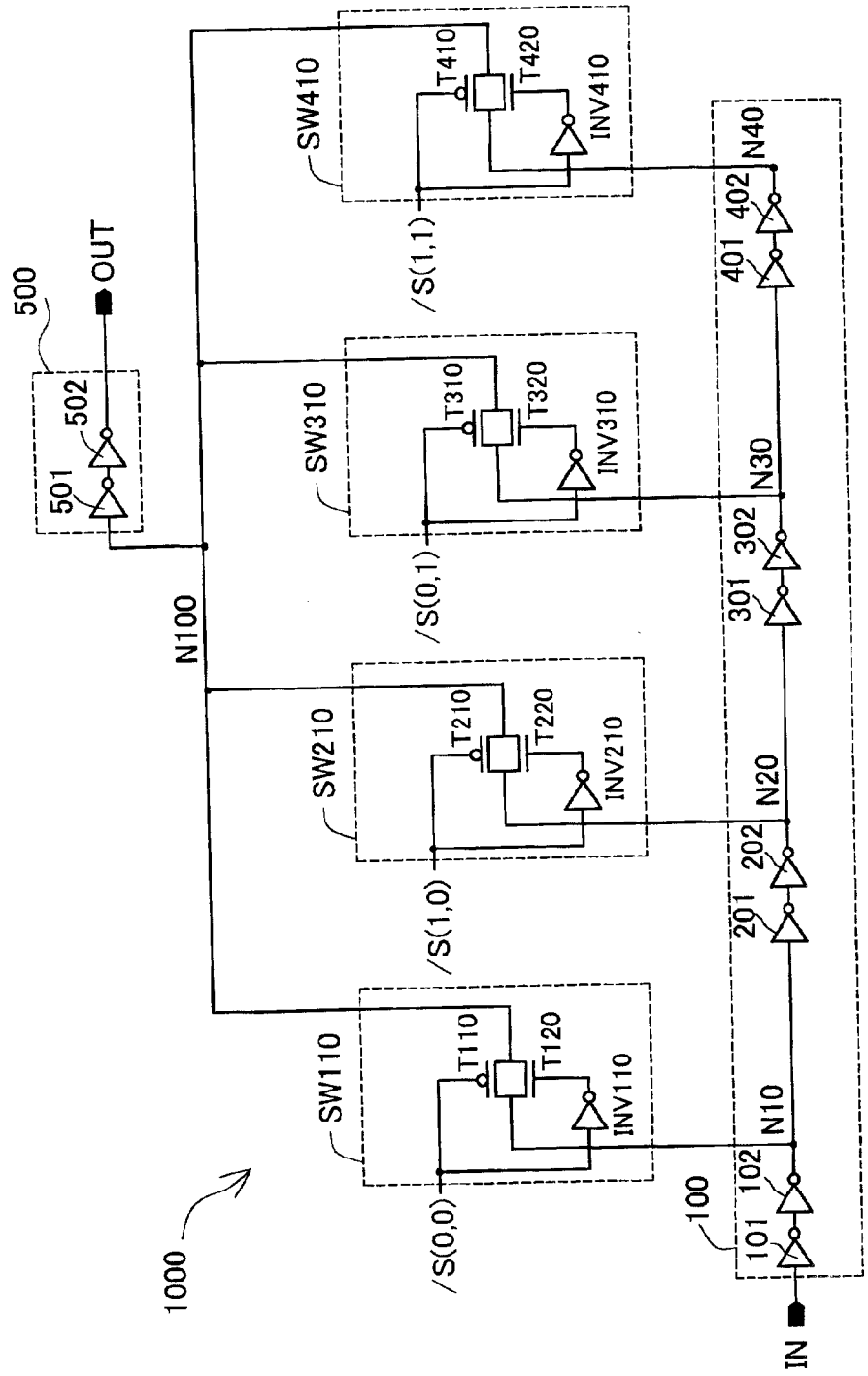
FIG. 8 is a circuit diagram showing a delay circuit according to the first related technology.
Figure 9:
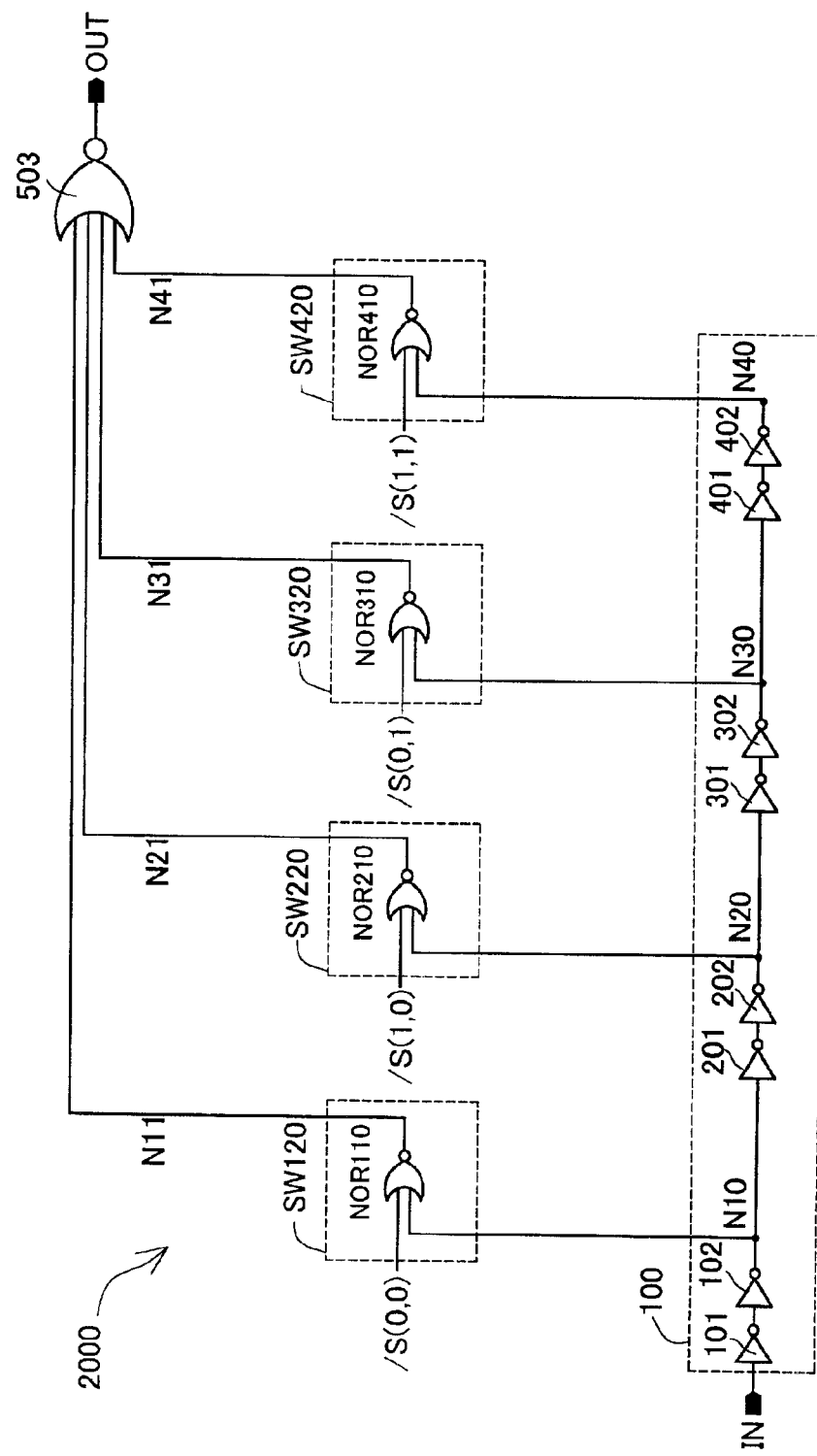
FIG. 9 is a circuit diagram showing a delay circuit according to the second related technology.
Figure 10:
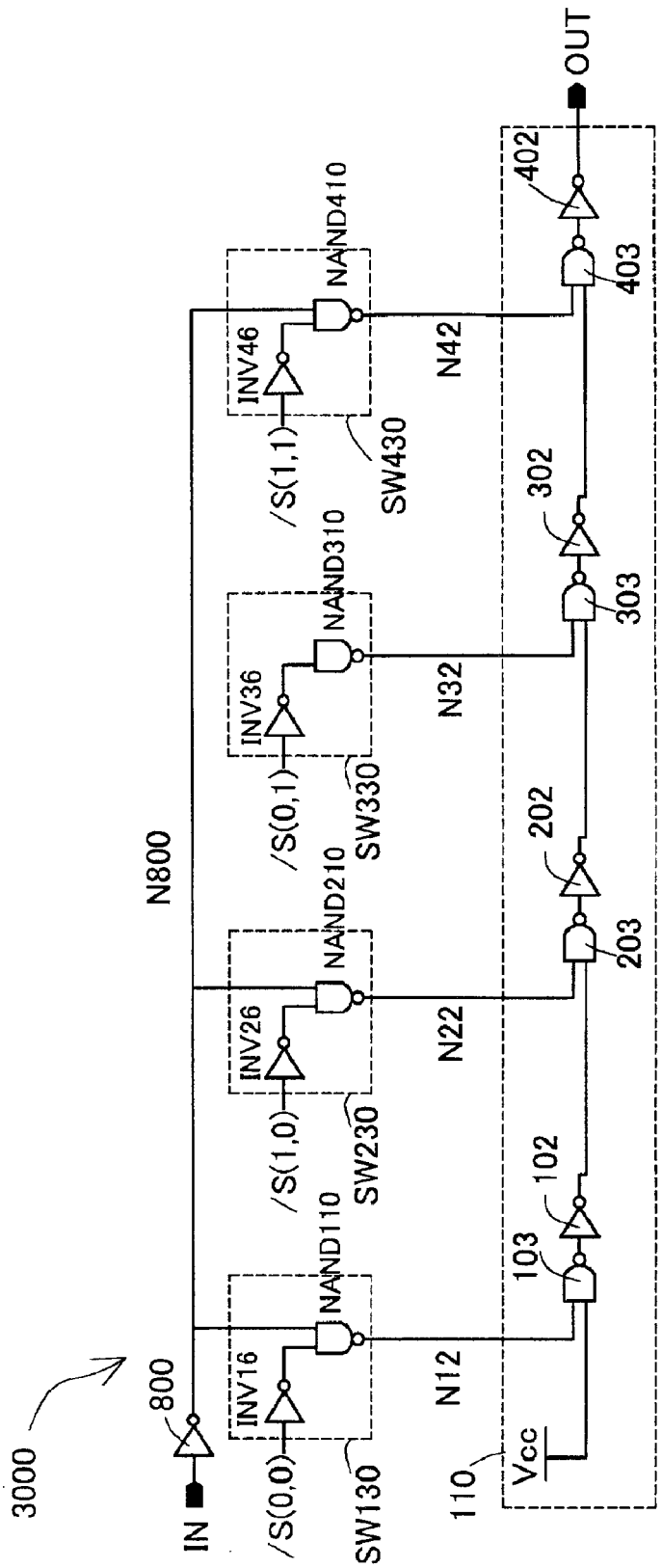
FIG. 10 is a circuit diagram showing a delay circuit according to the third related technology.

A delay circuit 1 of a first embodiment shown in FIG. 1 is provided with selecting switch sections (selecting switch means) SW11, SW21, SW31, and SW41 instead of the selecting switch sections SW110 through SW410 of the first delay circuit 1000 of the related technology (see FIG. 8). Unlike the selecting switch sections SW110 through SW410 of the first delay circuit 1000 of the related technology, because a logic inversion function is included in the selecting switch sections (selecting switch means) SW11 through SW41, the output buffer circuit 500 is changed from a two stage structure formed from the inverter gates 501 and 502 to an output buffer circuit 50 that has a one stage inverter gate structure.

The selecting switch section (selecting switch means) SW11 is formed from a buffer section (buffer means) and a selecting section (selecting section means). The buffer section (buffer means) comprises an output terminal N100 that connects together the drain terminals of the PMOS transistor T11 and the NMOS transistor T12. The gate terminals are also connected to form an input terminal that is connected to the individual delayed output terminal of predetermined delay stages 101 and 102 forming the delay section 100. In addition, a source terminal of the PMOS transistor T11 is connected to a drain terminal of the PMOS transistor T13 to form a series connection and is connected to the power supply voltage Vcc. The source terminal of the NMOS transistor T12 is also connected in the same way to the drain terminal of the NMOS transistor T14 to form a series connection and is connected to the ground potential Vss. The control signal /S(0,0), which is a low active signal, is input to the gate terminal of the PMOS transistor T13 while the control signal /S(0,0) is input to the gate terminal of the NMOS transistor T14 after being inverted by the inverter gate INV11, thus forming a delay path. The selecting section (selecting section means) is formed from the PMOS transistor T13 and the NMOS transistor T14.

The same structure also applies in the case of the selecting switches SW21 through SW41. Each buffer section (buffer means) is formed as an inverter gate with the PMOS and NMOS transistors T21 and T22 through T41 and T42 forming a pair. The gate terminals of these inverter gate structures form the input terminals N20 through N40 that are connected to the outputs of the inverter gates 202 through 402, which are the output terminals of each predetermined delay stage 201 and 202 through 401 and 402 in the delay section 100. In addition, the output terminals are joined together to form the terminal N100.

Moreover, the selecting sections (selecting section means) are formed with each of the drain terminals of the PMOS transistors T23 through T43 and of the NMOS transistors T24 through T44 connected to each of the source terminals of the PMOS and NMOS transistors T21 and T22 through T41 and T42 of the respective inverter gate structures forming the buffer section (buffer means). In addition, in each gate terminal, the control signals /S(1,0) through /S(1, 1) are input to the PMOS transistors T23 through T43 and are also input to the NMOS transistors T24 through T44 after being inverted by the inverter gates INV21 through INV41.

The output signals from the selecting switch circuits (selecting switch means) SW11 through SW41 are joined to form N100. The joined output terminal N100 is connected into the output buffer circuit 50 and an output signal is output from the output terminal OUT.

The input signal IN that is input into the predetermined delay stages 101 and 102 of the delay section 100 is delayed by being given a predetermined delay time at each of the predetermined delay stages 101 and 102 through 401 and 402. The delayed signal of each stage is output from the individual delayed output terminals N10 through N40 and is input into the buffer sections (buffer means) T11 and T12 through T41 and T42 of the respective selecting switch sections (selecting switch means) SW11 through SW41. In these selecting switch sections (selecting switch means) SW11 through SW41, as a result of only one of the control signals /S(0,0) through /S(1,1) input into the selecting sections (selecting section means) T13 and T14 through T43 and T44 becoming low level, only the buffer section (buffer means) T11 and T12 through T41 and T42 of the relevant selecting switch section (selecting switch means) SW11 through SW41 is activated. The signal from the activated selecting switch section (selecting switch means) SW11 through SW41 is output to the output terminals N100 from the selecting switch section (selecting switch means) SW11 through SW41 and a signal having the desired delay time is then output to the output terminal OUT from the output buffer circuit 50.

The output signals from the selecting switch circuits (selecting switch means) SW11 through SW41 are joined together to form the terminals N100. After the signal of the joined output terminal N100 have undergone logic inversion and waveform shaping by the output buffer circuit 50 and the securing of the drive capacity and the like has been performed, they are output from the output terminal OUT.

In the delay circuit 1 of the first embodiment, as described above, individual delayed output signals from the individual delayed output terminals N10 through N40 of each of the predetermined delay stages 101 and 102 through 401 and 402 are input into the buffer sections (buffer means) T11 and T12 through T41 and T42. The output terminals N100 are connected to each other. In this structure, because the selecting switch sections (selecting switch means) SW11 through SW41 are not formed from transfer gates or the like having a parasitic load, it is possible to form the delay path 1 with a simple circuit structure without a parasitic delay circuit such as a CR time constant circuit or the like having to be inserted. In addition, because it is possible using this circuit structure to keep the effects on the delay time of the parasitic load of the elements to the minimum, it is possible for the delay circuit 1 to be formed with a compact element size that does not cause any problems with the amount of the surface area of the chip that it occupies. Accordingly, there is no rounding of the actual signal waveform or signal propagation delay caused by parasitic delay circuits such as the CR time constant circuit on the delay path. In addition, even when the circuit is operating at short pulses, it is possible to accurately maintain the short pulses without the pulses becoming flattened. It is even possible to suppress any variations in the delay amount caused by inconsistencies in the production of the semiconductor integrated circuit device. In particular, even when the delay amount needs to be adjusted in minute time steps or when the input needs to be in short time pulses to match the advancing speed of the semiconductor integrated circuit device, it is possible to provide a delay circuit 1 that is capable of performing the delay adjustment with a high degree of accuracy. Furthermore, even though the delay circuit 1 allows the selecting of the appropriate delay time from a variety thereof, the area of the chip occupied by the delay circuit can be held to a compact size thus making a major contribution to further increased integration in semiconductor integrated circuit devices.

Moreover, because there is no need to perform a logic operation on propagated signals from the delay section having different delay times and then select the appropriate ones, there is no longer any need for the large wiring space needed for the placement of a large number of wires for each propagated signal. Nor is there any need for complex or large scale logic circuits for selecting the appropriate signal from among a multitude of propagated signals. Accordingly, it is possible for the area on the chip occupied by the delay circuit 1 to be kept small thus further contributing to increased integration in semiconductor integrated circuit devices.

In addition, the selecting switch sections (selecting switch means) SW11 through SW41 are formed from the PMOS transistors T11 and T13 through T41 and T43, which are first and second transistors connected in series, and the NMOS transistors T12 and T14 through T42 and T44, which are third and fourth transistors. Moreover, these are inserted between the output terminals of the selecting switch sections (selecting switch means) SW11 through SW41 and the ground potential Vss and the power supply voltage Vcc, which are first and second power supply voltages. The control signals /S(0,0) through /S(1,1) for establishing a delay path are input into the gate terminals of the PMOS transistors T13 through T43 and the NMOS transistors T14 through T44, and the PMOS transistors T11 through T41 can be connected between the output terminal N100 and the power supply voltage Vcc, while the NMOS transistors T12 through T42 can be connected between the output terminal N100 and the ground potential Vss. As a result, if the propagated signal from the delay section 100 is input into the gate terminal of the activated selecting switch sections (selecting switch means) SW11 through SW41 from among the PMOS transistors T11 through T41 and the NMOS transistors T12 through T42, then the delay path can be established. Because the output terminals N100 of the buffer sections (buffer means) T11 and T12 through T41 and T42 can be driven by two different power supply voltages, namely, the power supply voltage Vcc and the ground potential Vss, a pulse signal can be input as the input signal IN and can be output as a pulse signal which has been delayed by the addition of the desired delay time.

Furthermore, the PMOS and NMOS transistors T11 and T12 through T41 and T42 that are supplied with the power supply voltage Vcc and the ground potential Vss via the PMOS and NMOS transistors T13 and T14 through T43 and T44 are directly connected to the output terminals N100 of the selecting switch sections (selecting switch means) SW11 through SW41 without the PMOS and NMOS transistors T13 and T14 through T43 and T44 being interposed between them and the output terminals N100. Consequently, when the PMOS and NMOS transistors T11 and T12 through T41 and T42 are activated, no parasitic load from the PMOS and NMOS transistors T13 and T14 through T43 and T44 is inserted into the drive path and no parasitic delay circuit such as a CR time constant circuit is employed.

The parasitic capacitance applied to the mutually joined output terminals N100 of the selecting switch sections (selecting switch means) SW11 through SW41 forms a junction capacitance that is parasitic on the drain terminals of the PMOS and NMOS transistors T11 and T12 through T41 and T42. As a result, it is formed at a smaller parasitic capacitances than the sum of the input gate capacitances applied to the mutually joined input terminals N800 of the selecting switch sections SW130 through SW430 shown in the third related technology delay circuit.

The 0.2 µm process of a MOS type integrated circuit will be used as a specific example. In this process, in a standard MOS transistor it may be accepted that the gate oxide film thickness: d=7 nm, the channel length: L=0.35 µm, the channel width: W=6 µm, and the width of the drain terminal: P=0.8 µm. If the gate capacitance (Cg) is compared to the junction capacitance (Cj) of the drain terminals using a standard calculation formula, then the relationship between them is Cg≈4×CJ. The junction capacitance (Cj) is calculated as a value approximately one fourth the value of the gate capacitance (Cg) and it is possible to achieve a sizeable reduction in the parasitic capacitance.

Furthermore, because the drive capacity of the PMOS and NMOS transistors T13 through T43 and T14 through T44 forming the selecting sections (selecting section means) of the selecting switch sections (selecting switch means) SW11 through SW41 is greater than that of the PMOS and NMOS transistors T11 through T41 and T12 through T42 forming the buffer section (buffer means), when the buffer section buffer means is driving, there is no rate controlling of the drive capacity thereof caused by the existence of the PMOS and NMOS transistors T13 through T43 and T14 through T44 of the selecting sections (selecting section means).

The predetermined delay stages 101 and 102 through 401 and 402 of the delay section 100 are connected in multiple stages in series to form a delay path. In each of the predetermined delay stages 101 and 102 through 401 and 402, the unit delay stages 101 and 102 through 401 and 402 have a structure in which inverter gates, which are logic inversion sections in which the rise delay time and the fall delay time are balanced as basic units so as to be substantially uniform, are connected in two stages in series, Therefore, there is no change in the pulse width even when a pulse signal is propagated over a predetermined delay stage of a multi stage connection.

Figure 2:
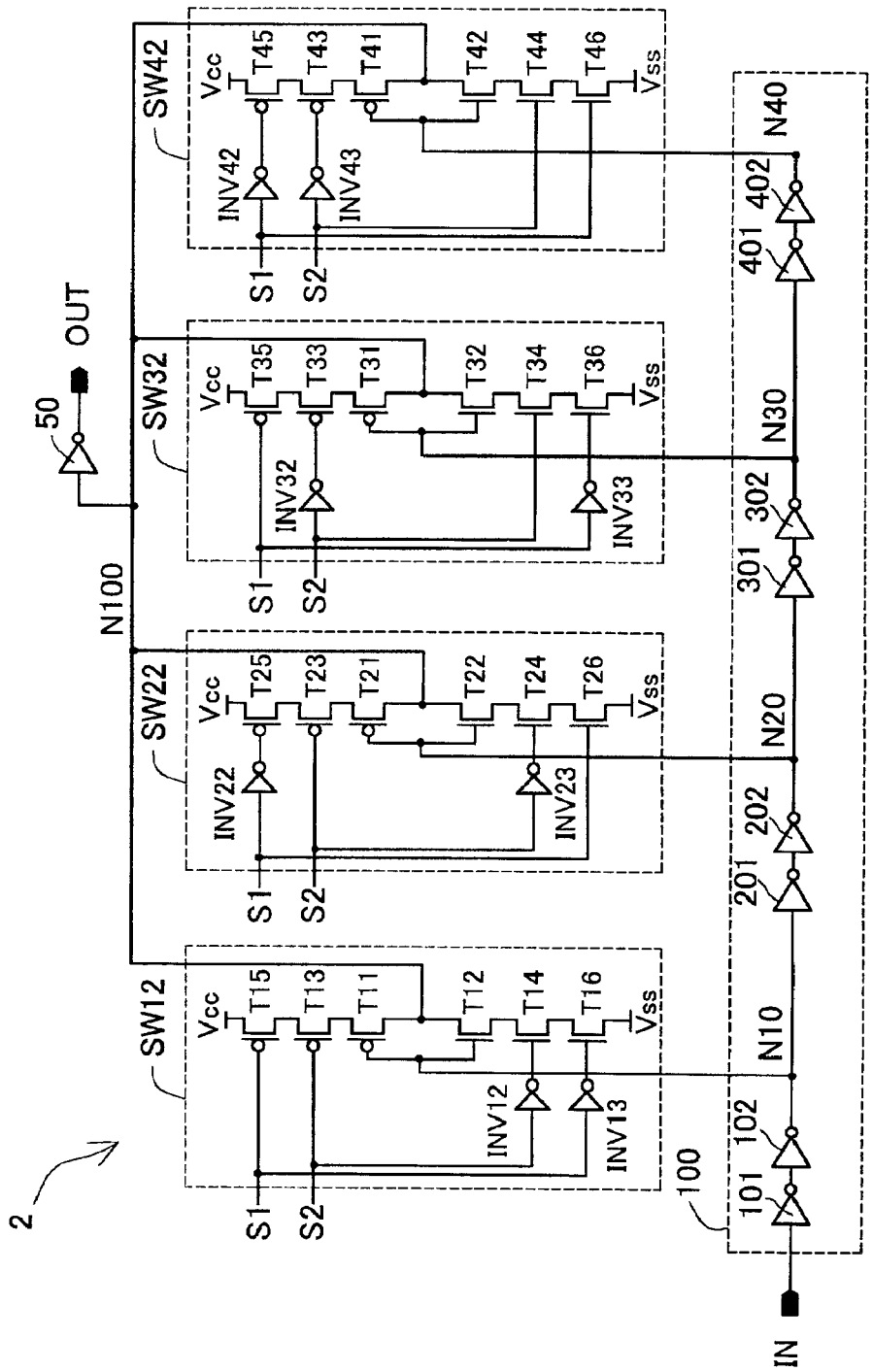
FIG. 2 is a circuit diagram showing the delay circuit according to a second embodiment.

In a delay circuit 2 of the second embodiment shown in FIG. 2, in addition of the PMOS transistors T13 through T43 and the NMOS transistors T14 through T44 in the selecting switch circuits (selecting switch means) SW11 through SW41 of the delay circuit 1 of the first embodiment (see FIG. 1), the PMOS transistors T15 through T45 and the NMOS transistors T16 through T46 are additionally connected in series to each of the source terminals to form the selecting switch circuits (selecting switch means) SW12 through SW42.

Two sets of control signals S1 and S2 are input into the gate terminals of the selecting sections (selecting section means). In the selecting section (selecting section means) of the selecting switch circuit (selecting switch means) SW12, the control signals S1 and S2 are input respectively into the PMOS transistors T15 and T13, while the control signals S1 and S2 are inverted by the inverter gates INV13 and INV12 and then input as inverted signals into the NMOS transistors T16 and T14. Combinations of the control signals S1 and S2 that each have different logic are input into the other selecting switch circuits (selecting switch means) SW22 through SW42. Namely, an inverted signal, formed by the inverter gate INV22 inverting the control signal S1, and the control signal S2 are input respectively into the PMOS transistors T25 and T23 of SW22, while an inverted signal, formed by the inverter gate INV23 inverting the control signal S2, and the control signal S1 are input respectively into the NMOS transistors T24 and T26 of SW22. An inverted signal, formed by the inverter gate INV32 inverting the control signal S2, and the control signal S1 are input respectively into the PMOS transistors T33 and T35 of SW32, while an inverted signal, formed by the inverter gate INV33 inverting the control signal S1, and the control signal S2 are input respectively into the NMOS transistors T36 and T34 of SW32. An inverted signal, formed by the inverter gate INV42 inverting the control signal S1, and an inverted signal, formed by the inverter gate INV43 inverting the control signal S2, are input respectively into the PMOS transistors T45 and T43 of SW42, while the control signal S1 and the control signal S2 are input respectively into the NMOS transistors T46 and T44 of SW42.

Because four states are represented by the logic combinations of the two sets of control signals S1 and S2, only one of the four selecting switch sections (selecting switch means) SW12 through SW42 is selected. The inverter gates INV12 and INV13 through INV42 and INV43 are provided to invert the control signals S1 and S2 and feed them appropriately to the gate terminals of the NMOS transistors T14, T16, T26, and T34 and the PMOS transistors T25, T33, T43, and T45 forming the selecting section (selecting section means). By selecting one group using the control signals S1 and S2 from among the PMOS transistors T13 and T15 through T43 and T45 connected to the power supply voltage Vcc and connected in series from the source terminals of the PMOS and NMOS transistors of the inverter gate structure forming the buffer sections (buffer means) of the selecting switch sections (selecting switch means) SW12 through SW42 and the NMOS transistors T14 and T16 through T44 and T46 connected to the ground potential Vss and connected in series, the buffer section (buffer means) of the relevant selecting switch section (selecting switch means) SW12 through SW42 is activated and the output terminals from the selecting switch section (selecting switch means) SW12 through SW42 are connected to the mutually connected terminal N100 so that a signal having the desired delay time is output from the output buffer circuit 50 to the output terminal OUT.

In the delay circuit 2 of the second embodiment, the structure described is one in which in order to ensure the drive capacity of the MOS transistors T13, T14, T15, and T16 through T43, T44, T45, and T46 forming the selecting sections (selecting section means) in the selecting switch sections (selecting switch means) SW12 through SW42, the inverter gates INV12 and INV13 through INV42 and INV43 for supplying inverted signals of the control signals S1 and S2 are provided for each transistor, however, when the drive capacity of the inverter gate is sufficient, it is also possible for the inverted signals to be supplied from one inverter gate.

As has been described above, the delay circuit 2 of the second embodiment is an example of when the delay path in the delay section 100 is established using the logic combinations of control signals S1 and S2, which are two composite control signals. Instead of the PMOS transistors T13 through T43 and the NMOS transistors T14 through T44, there are provided the PMOS transistors T13 and T15 through T43 and T45 and the NMOS transistors T14 and T16 through T44 and T46, which are transistor rows comprising two transistors connected together in series, that have the same capacities as the above transistors and into each of whose gate terminals the control signals S1 and S2 are input. As a result, it is possible to select the four selecting switch sections (selecting switch means) SW12 through SW42 with the two control signals S1 and S2 and, thus, it is possible to select a greater number of selecting switch sections (selecting switch means) with a fewer number of control signals. If the time width of the desired delay time is widened or if the time steps are shortened and the number of stages in the delay section 100 is increased, it is possible to control the selecting switch sections (selecting switch means) using a fewer number of control signals which results in a large reduction in the wiring area.

Note that the basic operation and effects of the second embodiment are the same as those of the first embodiment.

Figure 3:
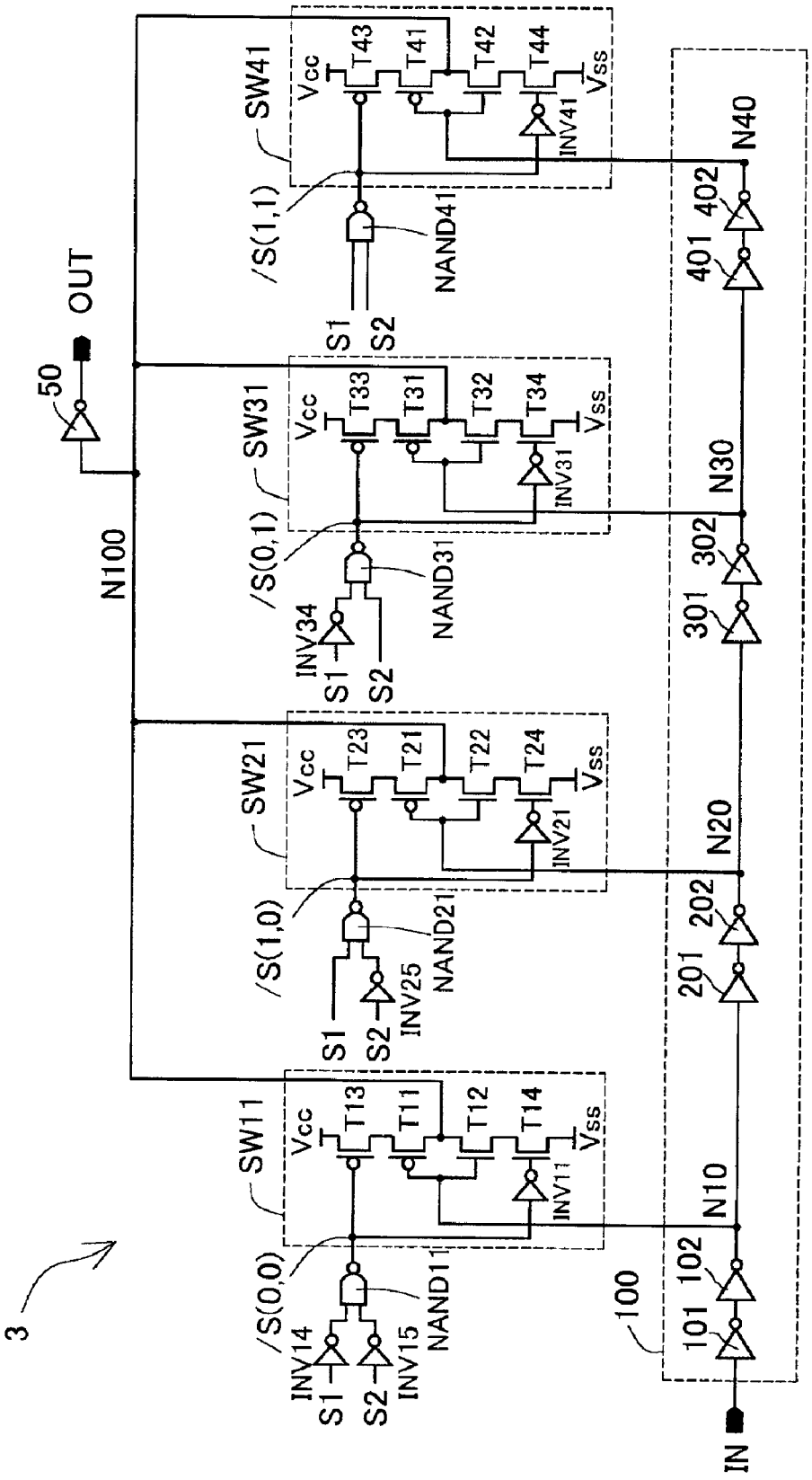
FIG. 3 is a circuit diagram showing the delay circuit according to a third embodiment.

A delay circuit 3 of the third embodiment shown in FIG. 3 has a structure in which there is provided a predecoding section for generating the control input signals /S(0,0) through /S(1,1) input into the selecting switch circuits (selecting switch means) SW11 through SW41 of the delay circuit 1 of the first embodiment (see FIG. 1). In the same way, in the delay circuit 2 of the second embodiment (see FIG. 2), the selecting switch sections (selecting switch means) SW11 through SW41 are selected using the two control signals S1 and S2.

The predecoding section generates control input signals /S(0,0) through /S(1,1) by using the NAND gates NAND11 through NAND41 to perform a logic operation on the control signals S1 and S2 either as they are or after inverting them if required. Namely, the predecoding section that generates the control input signal /S(0,0) to select the selecting switch section (selecting switch means) SW11 is formed from the inverter gates INV14 and INV15 into which the control signals S1 and S2 are input and the NAND gate NAND11 into which the outputs from the inverter gates INV14 and INV15 are input. The predecoding section that generates the control input signal /S(1,0) is formed from the inverter gate INV25 into which the control signal S2 is input and the NAND gate NAND21 into which the control signal S1 and the outputs from and the inverter gate INV25 are input. The predecoding section that generates the control input signal /S(0,1) is formed from the inverter gate INV34 into which the control signal S1 is input and the NAND gate NAND31 into which the control signal S2 and the output from the inverter gate INV34 are input. The predecoding section that generates the control input signal /S(1,1) is formed from the NAND gate NAND41 into which the control signals S1 and S2 are input.

Four states are represented by the logic combinations of the two control signals S1 and S2. The circuit operation in which only one of the four selecting switch sections (selecting switch means) SW11 through SW41 is selected is the same as that of the delay circuit 2 of the second embodiment. In the delay circuit 3 of the third embodiment, while the structure of the selecting switch sections (selecting switch means) SW11 through SW41 is the same as in the first embodiment, a predecoding section for predecoding control signals is provided externally and the control input signals /S(0,0) through /S(1,1) are generated. As a result of this structure, it is possible to hold the number of series connection stages of the MOS transistors in the selecting switch sections (selecting switch means) SW11 through SW41 to the minimum of two stages and to obtain the maximum drive capacity from the buffer sections (buffer means) T11 and T12 through T41 and T42 in the selecting switch sections (selecting switch means) SW11 through SW41.

The delay circuit 3 of the third embodiment is the same as the delay circuit 2 of the second embodiment in the fact that, when the delay path in the delay section 100 is established using the logic combinations of control signals S1 and S2, which are two composite control signals, it is possible to select a greater number of selecting switch sections (selecting switch means) using a fewer number of control signals, and in the fact that, if the time width of the desired delay time is widened or if the time steps are shortened and the number of stages in the delay section 100 is increased, it is possible to control the selecting switch sections (selecting switch means) using a fewer number of control signals which results in a large reduction in the wiring area.

The remaining basic operation and effects of the delay circuit 3 of the third embodiment are the same as those of the first embodiment.

Figure 4:
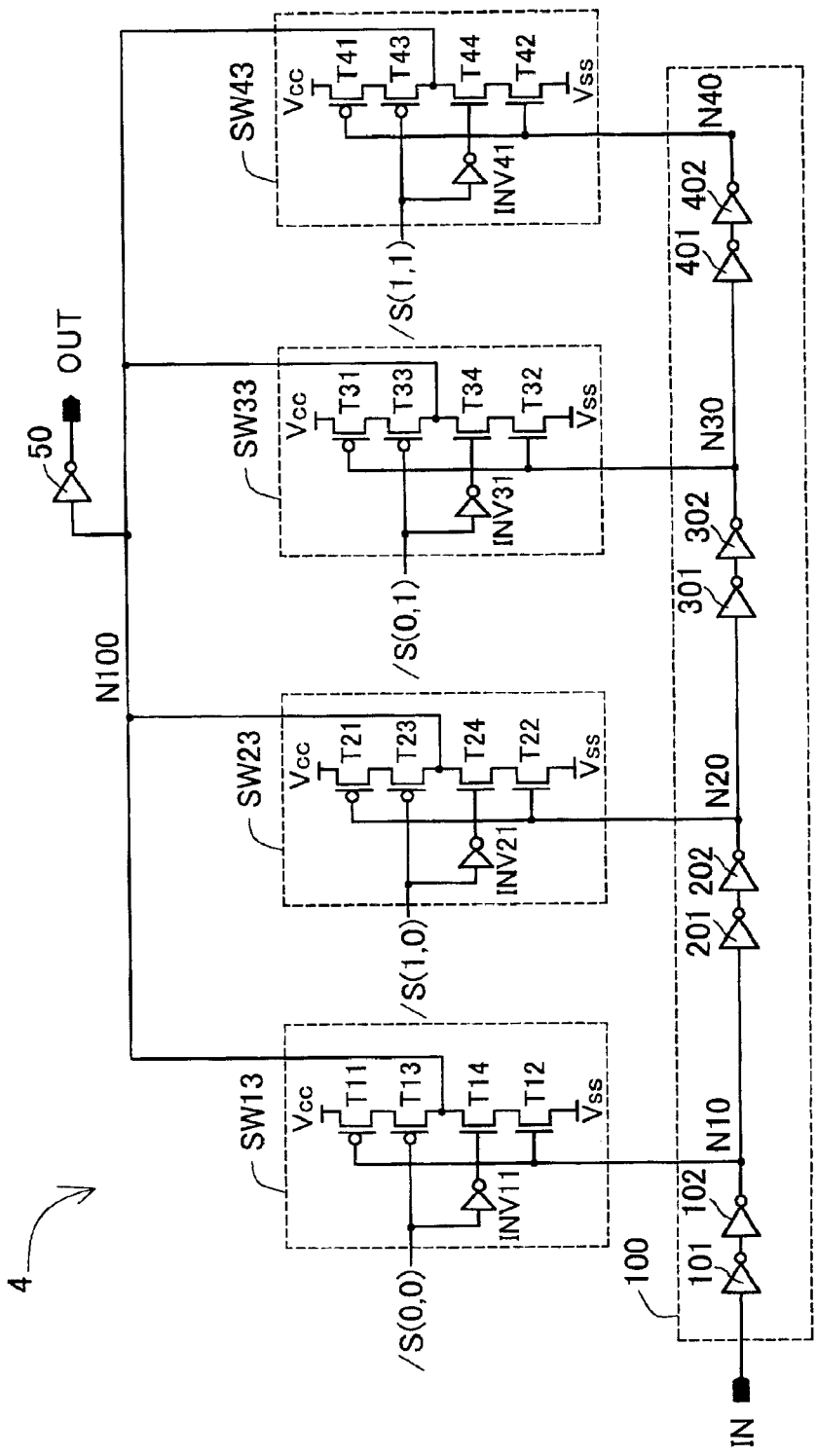
FIG. 4 is a circuit diagram showing the delay circuit according to a fourth embodiment.

A delay circuit 4 of the fourth embodiment shown in FIG. 4 is structured with the MOS transistors of the selecting section (selecting section means) and the buffer section (buffer means) exchanged for each other in the selecting switch circuits (selecting switch means) SW11 through SW41 in the delay circuit 1 of the first embodiment (see FIG. 1). Namely, the source terminals of the PMOS transistors T11 through T41 forming the buffer section (buffer means) are connected to the power supply voltage Vcc while the drain terminals are connected to the source terminals of the PMOS transistors T13 through T43 forming the selecting section (selecting section means). In addition, the source terminals of NMOS transistors T12 through T42 of the buffer section (buffer means) are connected to the ground potential Vss while the drain terminals are connected to the source terminals of NMOS transistors T14 through T44 of the selecting section (selecting section means). The drain terminals of the PMOS transistors T13 through T43 and the drain terminals of the NMOS transistors T14 through T44 are connected and form the output terminals N100 of the selecting switch sections (selecting switch means) SW13 through SW43.

Because the relationship of the connection between the buffer section buffer means and the selecting section (selecting section means) is the reverse of that in the delay circuit 1 of the first embodiment (see FIG. 1), the individual delayed output terminals N10 through N40 of each of the predetermined delay stages 101 and 102 through 401 and 402 of the delay section 100 are connected to the gate terminals of the PMOS transistors T11 through T41 connected to the power supply voltage Vcc side and to the gate terminals of the NMOS transistors T12 through T42 connected to the ground potential Vss side. Propagated signals input from the individual delayed output terminals N10 through N40 are input into the selecting switch sections (selecting switch means) SW13 through SW43 in a state separated from the output terminals N100. Although this difference does exist, the fact that the PMOS transistors T11 and T13 through T41 and T43 forming the buffer section (buffer means) and the selecting section (selecting section means) are connected in series between the power supply voltage Vcc and the output terminals N100, and also the fact that the NMOS transistors T12 and T14 through T42 and T44 are connected in series between the ground potential Vss and the output terminals N100 are the same as in the structure of the delay circuit 1 of the first embodiment. Accordingly, the operation of the delay circuit 4 of the fourth embodiment is the same as that of the delay circuit 1 of the first embodiment.

In the delay circuit 4 of the fourth embodiment as described above, the PMOS and NMOS transistors T11 through T41 and T12 through T42 connected to the power supply voltage Vcc and the ground potential Vss are connected to the output terminals N100 of the selecting switch sections (selecting switch means) SW13 through SW43 via the PMOS and NMOS transistors T13 through T43 and T14 through T44. Because the PMOS and NMOS transistors T13 through T43 and T14 through T44 are inserted between the PMOS and NMOS transistors T11 through T41 and T12 through T42 and the output terminals N100, when the PMOS and NMOS transistors T11 through T41 and T12 through T42 are activated, the effects from the level transition of the propagated signal input into the gate terminal do not appear at the output terminals N100.

Note that the remainder of the basic operation and effects are the same as those of the first embodiment.

Figure 5:
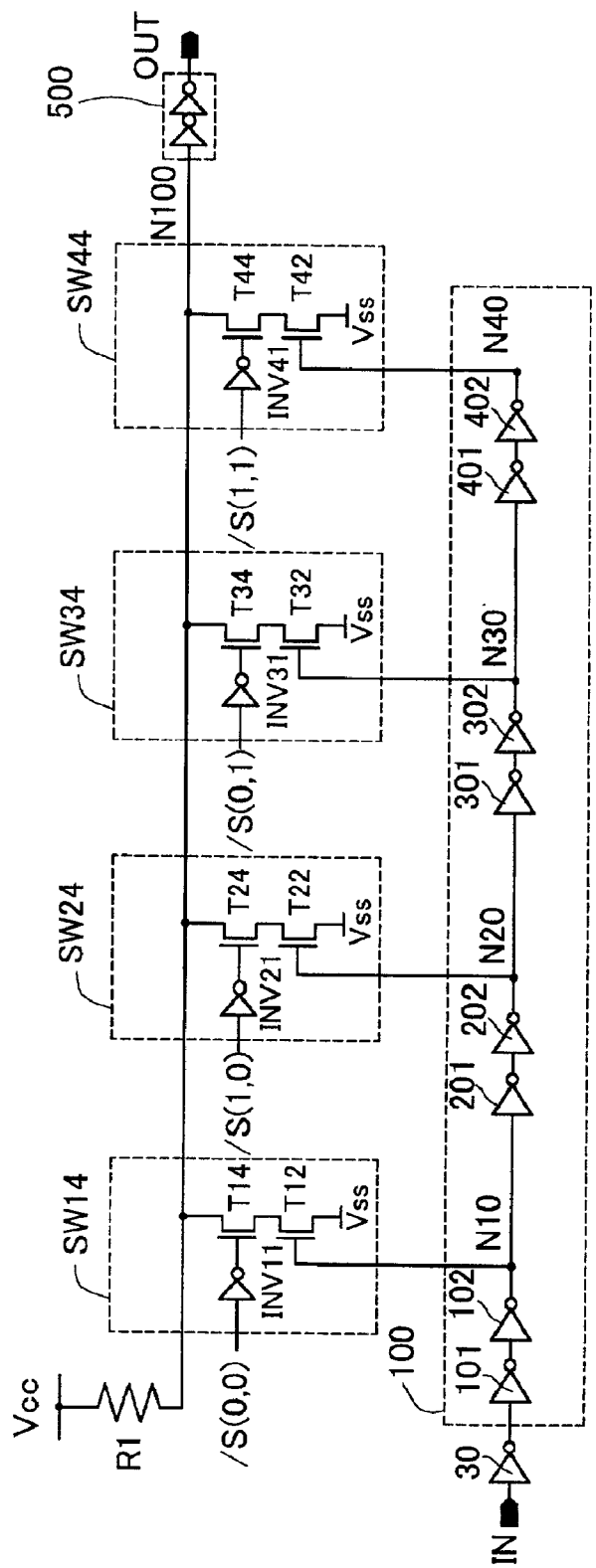
FIG. 5 is a circuit diagram showing the delay circuit according to a fifth embodiment.

A delay circuit 5 of the fifth embodiment shown in FIG. 5 is structured such that, instead of the selecting switch sections SW110 through SW410 in the delay circuit 1000 of the first related technology (see FIG. 8), there are provided selecting switch sections (selecting switch means) SW14 through SW44 and a pull-up resistor R1 used for precharging is provided between the output terminal N100 of the selecting switch sections (selecting switch means) SW14 through SW44 and the power supply voltage Vcc. The delay circuit 5 of the fifth embodiment outputs an output signal having the desired delay time relative to the fall transition of the input signal IN.

The selecting switch sections (selecting switch means) SW14 through SW44 are formed from: NMOS transistors T12 through T42 whose gate terminals are connected to the individual delayed output terminals N10 through N40 from the delay section 100; NMOS transistors T14 through T44 whose source terminals are connected to these drain terminals; and inverter gates INV11 through INV41 for inputting into the gate terminals of the NMOS transistors T14 through T44 inverted signals of the control input signals /S(0,0) through /S(1,1). The source terminals of the NMOS transistors T12 through T42 are connected to the ground potential Vss and the drain terminals of the NMOS transistors T14 through T44 are connected to the output terminals N100 of the selecting switch sections (selecting switch means) SW14 through SW44. The NMOS transistors T12 through T42 form the buffer section (buffer means) while the NMOS transistors T14 through T44 form the selecting section (selecting section means).

A predetermined preset period is set before the input signal IN is input. For this period, all of the control signals /S(0,0) through /S(1,1) are set at high level and all of the selecting switch sections (selecting switch means) SW14 through SW44 are set as not selected so that a path is opened for the potential of the output terminals N100 to reach the ground potential Vss. Because the pull-up resistor R1 is connected to the output terminals N100 between them and the power supply voltage Vcc, during this preset period, the output terminals N100 are preset to the potential of the power supply voltage Vcc.

When the preset period has elapsed, only one signal from among the control signals /S(0,0) through /S(1,1) is selected and becomes a low level signal and the relevant selecting switch section (selecting switch means) SW14 through SW44 is placed in a selected state. Before the fall transition of the input signal IN, the output terminals N100 maintain a high level without signal transition being generated. Therefore, the output terminal OUT of the delay circuit 5 also maintains a high level.

When the input signal IN makes fall transition, the signal transition is propagated in the delay section 100 and after a predetermined delay time, the fall transition is propagated in the relevant selecting switch sections (selecting switch means) SW14 through SW44. At this time, because the input signal IN is logically inverted by the inverter gate 30 before being input into the delay section 100, it makes a rise transition at the individual delayed output terminals of the delay section 100. As a result, the relevant transistor from among the NMOS transistors T12 through T42 forming the buffer section (buffer means) is conducted and the potential is drawn out from the output terminals N100. The terminals N100 change to a low level and the signal undergoes waveform shaping by the output buffer circuit 500, and a delay fall transition to which the desired delay time has been added is output from the output terminal OUT.

In the delay circuit 5 of the fifth embodiment as described above, the selecting switch sections (selecting switch means) SW14 through SW44 are formed from the NMOS transistors T12 and T14 through T42 and T44, which are first and second transistors connected in series between the output terminals N100 and the ground potential Vss, and it is possible to input into the gate terminals of the NMOS transistors T14 through T44 via the inverter gates INV11 through INV41 control signals /S(0,0) through /S(1,1) for establishing a delay path, and to connect the NMOS transistors T12 through T42 between the ground potential Vss and the output terminals N100. As a result, it is possible to connect the individual delayed output terminals N10 through N40 from the delay section 100 to the gate terminals of the NMOS transistors T12 through T42 activated by the NMOS transistors T14 through T44 and to establish a delay path when a propagated signal is input. In order to activate the NMOS transistors T12 through T42 forming the buffer section (buffer means), there is no need to insert on the delay path a parasitic load such as a transfer gate or the like. Moreover, it is possible using this circuit structure to reduce the effects on the delay time from the parasitic load of the elements to the minimum. Therefore, it is possible to construct the delay circuit 5 with a small element size that does not occupy an overly large amount of the chip surface area. Accordingly, no parasitic delay circuit such as a CR time constant circuit or the like is formed on the delay path formed from the delay section 100 via the selecting switch sections (selecting switch means) SW14 through SW44 and there is no rounding of the signal waveform itself or signal propagation delay based on the circuit 5. It is even possible to suppress any variations in the delay amount caused by inconsistencies in the production of the semiconductor integrated circuit device. In particular, even when the delay amount needs to be adjusted in minute time steps to match the advancing speed of the semiconductor integrated circuit device, it is possible to provide a delay circuit 5 that is capable of performing the delay adjustment with a high degree of accuracy. Furthermore, even though the delay circuit 5 allows the appropriate desired delay time to be selected from the several individual delayed output terminals N10 through N40, the area of the chip occupied by the delay circuit can be held to a compact size thus making a major contribution to further increased integration in semiconductor integrated circuit devices.

Furthermore, because the NMOS transistors T12 through T42 connected to the ground potential Vss are connected to the output terminals N100 of the selecting switch sections (selecting switch means) SW14 through SW44 via the NMOS transistors T14 through T44, and because the NMOS transistors T14 through T44 are inserted between the NMOS transistors T12 through T42 and the output terminals N100, when the NMOS transistors T12 through T42 are activated, the effects from the level transition of the propagated signal input into the gate terminal from the individual delayed output terminals N10 through N40 do not appear at the output terminals N100.

It is ideal if the drive capacity of the NMOS transistors T14 through T44 forming the selecting section (selecting section means) of the selecting switch sections (selecting switch means) SW14 through SW44 is set greater than that of the NMOS transistors T12 through T42 forming the buffer section (buffer means), so that when the buffer section (buffer means) is driven, there is no rate controlling of the drive capacity due to the existence of the NMOS transistors T14 through T44.

Note that it is of course possible for various alterations of the above structure to be implemented. For example, the relationship of the connections between the NMOS transistors T14 through T44 forming the selecting section (selecting section means) and the NMOS transistors T12 through T42 forming the buffer section (buffer means) in the selecting switch section (selecting switch means) SW14 through SW44 can be reversed. In addition, it is possible for predecode sections or selecting sections (selecting section means) corresponding to two or more control signals to be provided, or for the polarities of these transistors to be reversed and a delay signal to be generated in response to a rise transition input signal IN.

By reversing the relationship of the connections, there is no parasitic load inserted on the drive path of the NMOS transistors T12 through T42 from the NMOS transistors T14 through T44 and there is no need for a parasitic delay circuit such as a CR time constant circuit or the like. By providing predecode sections or selecting sections (selecting section means) having two or more inputs, it is possible to limit the number of control signals even in a multi stage connection delay section 100. If the polarities of the transistors are reversed, it is possible to add a delay to a rise transition input signal IN.

If a fall transition delay circuit and a rise transition delay circuit are used in a suitable combination, then it is possible to input a pulse signal for the input signal IN and to select an arbitrary delay time for each fall transition and rise transition of the pulse signals. As a result, delayed pulse signals whose pulse widths have been altered as desired can be obtained.

Note that the remaining basic operation and effects are the same as those in the first and fourth-embodiments.

It should be noted that a "buffer section" or buffer means is constituted by PMOS/NMOS transistors T11/T12 through T41/T42. Furthermore, a "selecting section means" is constituted by NAND/NOR gates NAND12/NOR11 through NAND42/NOR41 that control connection to the PMOS/NMOS transistors T11/T12 through T41/T42 in response to inversion signals of control signals /S(0,0) through /S(1,1).

Figure 6:
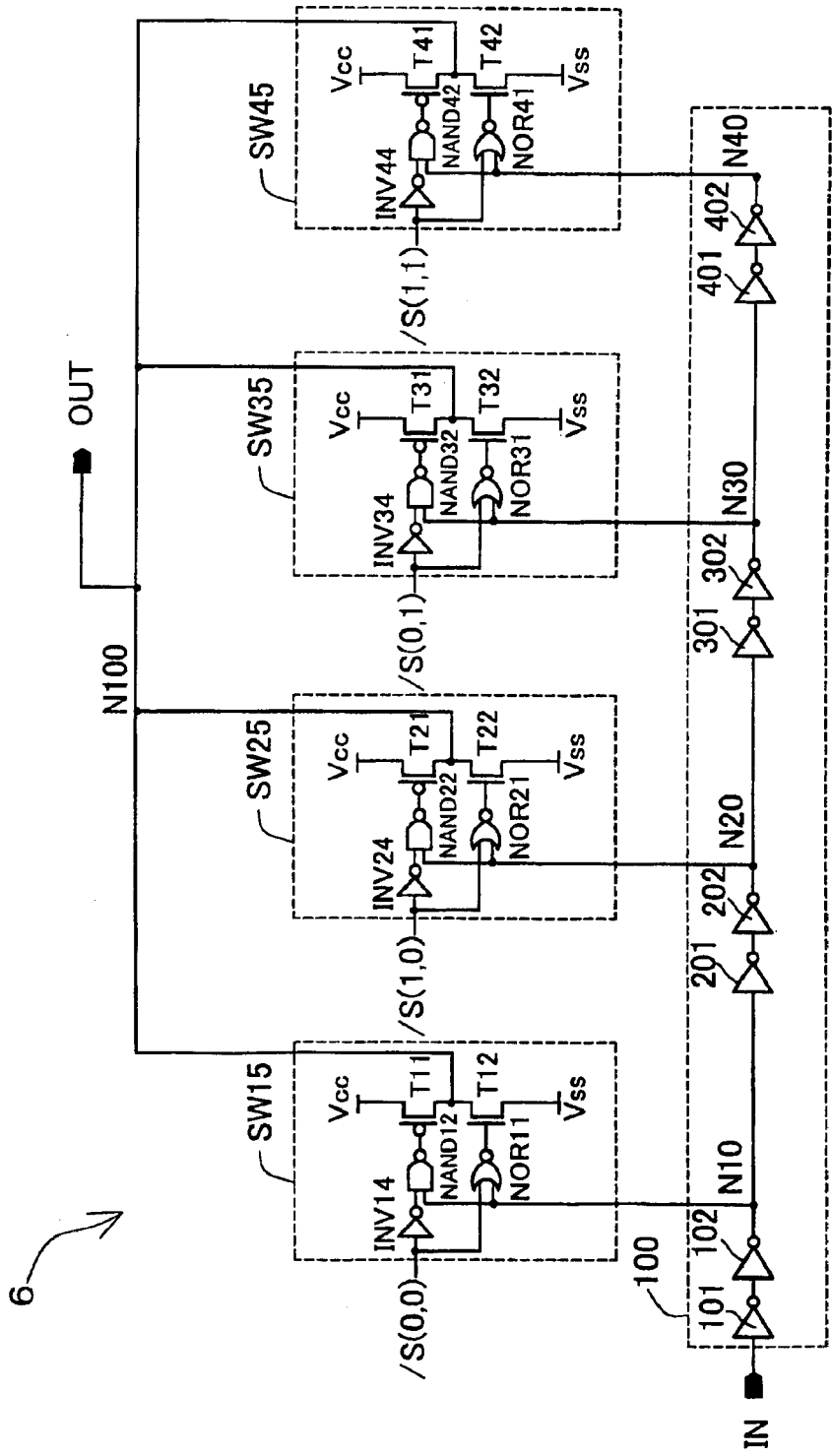
FIG. 6 is a circuit diagram showing the delay circuit according to a sixth embodiment.

In a delay circuit 6 of the sixth embodiment shown in FIG. 6, tri-state buffer circuits (buffer means) are used in the selecting switch sections (selecting switch means) SW15 through SW45. The tri-state buffer circuits (buffer means) shown here have the same circuit structure as that generally used in output buffers and the like. Namely, the output terminals N100 are driven by the PMOS transistors T11 through T41 provided between the power supply voltage Vcc and the output terminals N100 and by the NMOS transistors T12 through T42 provided between the ground potential Vss and the output terminals N100. The gate terminals of the PMOS transistors T11 through T41 are connected to NAND gates NAND12 through NAND42 for controlling the individual delayed output terminals N10 through N40 from the delay section 100 using inverted signals of the control signals /S(0,0) through /S(1,1). The gate terminals of the NMOS transistors T12 through T42 are connected to NOR gates NOR11 through NOR41 for controlling the individual delayed output terminals N10 through N40 from the delay section 100 using the control signals /S(0,0) through /S(1,1). The inverter gates INV14 through INV44 are provided in order to invert the control signals /S(0,0) through /S(1,1).

When high level signals are output with the control signals /S(0,0) through /S(1,1) in a non-selected state, the input into the NAND gates NAND12 through NAND42 is low level and the output is high level. The input into the NOR gates NOR11 through NOR41 is high level and the output is low level. Accordingly, the PMOS transistors T11 through T41 and the NMOS transistors T12 through T42 are both placed in an off state and the selecting switch sections (selecting switch means) SW15 through SW45 are placed in a non-selected state. When the control signals /S(0,0) through /S(1,1) become low level, the output from the NAND gates NAND12 through NAND42 and the NOR gates NOR11 through NOR41 is inverted. Consequently, the PMOS transistors T11 through T41 and the NMOS transistors T12 through T42 are operated in accordance with the propagated signals from the individual delayed output terminals N10 through N40 and the selecting switch sections (selecting switch means) SW15 through SW45 are placed in a selected state.

In delay circuit 6 of the sixth embodiment as described above, because in the selecting switch sections (selecting switch means) SW15 through SW45 that are formed from tri-state buffer circuits (buffer means) the structure does not include transfer gates or the like having a parasitic load, it is possible to form a delay path with a simple circuit structure in which the output terminals N100 of the selecting switch sections (selecting switch means) SW15 through SW45 are joined to each other without a parasitic delay circuit such as a CR time constant circuit or the like having to be inserted. In addition, because it is possible using this circuit structure 6 to keep the effects on the delay time of the parasitic load of the elements to the minimum, it is possible for the delay circuit 6 to be formed with a compact element size that doesn't cause any problems with the amount of the surface area of the chip that it occupies. Accordingly, there is no rounding of the actual signal waveform or signal propagation delay caused by parasitic delay circuits such as the CR time constant circuit on the delay path. In addition, even when the circuit is operating at short pulses, it is possible to accurately maintain short pulses without the pulses becoming flattened. It is even possible to suppress any variations in the delay amount caused by inconsistencies in the production of the semiconductor integrated circuit device. In particular, even when the delay amount needs to be adjusted in minute time steps or when the input needs to be in short time pulses to match the advancing speed of the semiconductor integrated circuit device, it is possible to provide a delay circuit 6 that is capable of performing the delay adjustment with a high degree of accuracy. Furthermore, even though the delay circuit 6 allows the selecting of the appropriate desired delay time, the area of the chip occupied by the delay circuit can be held to a compact size thus making a major contribution to further increased integration in semiconductor integrated circuit devices.

Moreover, because there is no need to perform a logic operation on propagated signals from the delay section having different delay times and then select the appropriate ones, there is no longer any need for the large wiring space needed for the placement of a large number of wires for each propagated signal. Nor is there any need for complex or large scale logic circuits for selecting the appropriate signal from among a multitude of propagated signals. Accordingly, it is possible for the area on the chip occupied by the delay circuit 6 to be kept small thus further contributing to increased integration in semiconductor integrated circuit devices.

In addition, the predetermined delay stages 101 and 102 through 401 and 402 of the delay section 100 are connected in multiple stages in series to form a delay path. In each of the predetermined delay stages 101 and 102 through 401 and 402, the unit delay stages 101 and 102 through 401 and 402 have a structure in which inverter gates, which are logic inversion sections in which the rise delay time and the fall delay time are balanced as basic units so as to be substantially uniform, are connected in two stages in series. Accordingly, there is no change in the pulse width even when a pulse signal is propagated over a predetermined delay stage of a multi stage connection.

Note that the remaining basic operation and structure are the same as those of the first embodiment.

It should be noted that "selecting switch means" is constituted by NAND gates NAND13 through NAND43 to which inversion signals of control signals /S(0,0) through /S(1,1) may be supplied.

Figure 7:
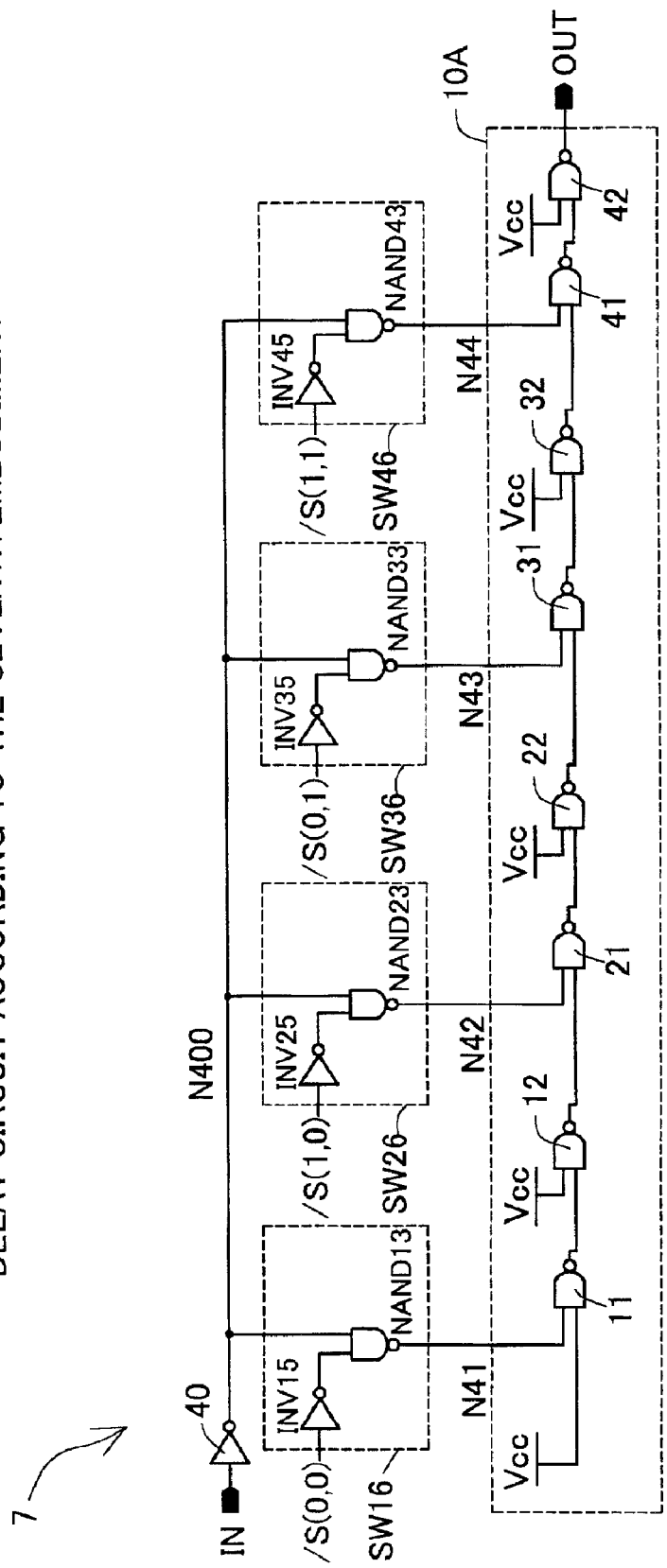
FIG. 7 is a circuit diagram showing the delay circuit according to a seventh embodiment.

A delay circuit 7 of the seventh embodiment shown in FIG. 7 is structured such that input signal IN are input from the mutually joined terminals N400 to the individual delay input terminals N41 through N44 of the respective predetermined delay stages 11 and 12 through 41 and 42 of the delay section 10A via the selecting switch sections (selecting switch means) SW16 through SW46. Signals are propagated via those selecting switch sections (selecting switch means) SW16 through SW46 from among these that have been activated by control signals /S(0,0) through /S(1,1).

In the selecting switch sections (selecting switch means) SW16 through SW46, the output from the NAND gates NAND13 through NAND 43 is input into the individual delay input terminals N41 through N44 of the delay section 10A. Input signal IN that have been inverted by the inverter gate 40 is input into the NAND gates NAND13 through NAND43 as are inverted signals of the control signals /S(0,0) through /S(1,1) that are input for control. The inverter gates INV15 through INV45 generate inverted signals of the control signals /S(0,0) through /S(1,1).

In the delay section 10A, the predetermined delay stages are formed from NAND gates 11 and 12 through 41 and 42 each having a two stage structure in which the terminal on one side is connected to the power supply voltage Vcc. By connecting the terminal on one side to the power supply voltage Vcc, the NAND gates 11 and 12 through 41 and 42 are made to function as logic inversion gates.

In the selected selecting switch sections (selecting switch means) SW16 through SW46, because the NAND gates NAND13 through NAND43 become logic inversion gates, a propagated signal that has been delayed in combination with the inverter gate 40 by two stages from the input signal IN is input into the individual delay input terminals N41 through N44 of the delay section 10A. The input propagated signal is sequentially propagated through the predetermined delay stages 11 and 12 through 41 and 42 connected in several stages in the delay section 10A, a predetermined delay time is added thereto, and a delayed signal having the desired delay time is output from the output terminal OUT.

Here, because the drive capacity of the NAND gates 11 and 12 through 41 and 42 is different due to the circuit structures for the rise transition and fall transition of the output, the delay time needed for each transition is different. In order to nullify this imbalance, each of the individual NAND gates 11 and 12 through 41 and 42 that perform the logic inversion operation forms, as a pair in two stages, the predetermined delay stages 11 and 12 through 41 and 42. Due to this connection, the rise delay time and the fall delay time are balanced so as to be substantially uniform.

In the delay circuit 7 of the seventh embodiment described above, the mutually joined terminals N400 are connected to the inputs of the NAND gates 11 and 12 through 41 and 42, which are predetermined delay stages that are connected in series in several stages, via the selecting switch sections (selecting switch means) SW16 through SW46 that have been activated as required by the control signals /S(0,0) through /S(1,1). Each NAND gate 11 and 12 through 41 and 42 is a logic inversion section in which the rise delay time and fall delay time are different. By connecting these in series in a two stage pair structure, it is possible to form a structure in which the rise delay time and fall delay time of the NAND gates 11 and 12 through 41 and 42, which are predetermined delay stages, are balanced so as to be substantially the same. As a result, even when a pulse signal is input, there is no variation in the pulse width.

The result of this is that, using the selecting switch sections (selecting switch means) SW16 through SW46 in which the input terminals N400 are mutually joined, in this structure, in which a signal is input into the delay path of the delay section 10A that has been activated in the appropriate manner so as to have the desired delay time, because the rise delay time and fall delay time of the predetermined delay stages of the delay section 10A are balanced so as to be substantially the same, even when multiple predetermined delay stages are connected together in order to obtain the desired delay time, there is no variation in the pulse width of an input pulse signal. Nor is there any need to insert a parasitic load such as a transfer gate into the delay path. Moreover, because it is possible using this circuit structure to keep to the minimum any effects on the delay time of the parasitic load of the elements by not forming a parasitic delay circuit such as a CR time constant, it is possible to form the circuit 7 with a compact element size that does not occupy too much of the surface area of the chip. Accordingly, even when the circuit is operating at short pulses, it is possible to accurately maintain short pulses without the pulses becoming crushed. In addition, there is no rounding of the actual signal waveform or signal propagation delay as no parasitic delay circuit is provided. In particular, even when the delay amount needs to be adjusted in short time pulses in minute time steps to match the advancing speed of the semiconductor integrated circuit device, it is possible to provide a delay circuit 7 that is capable of performing the delay adjustment with a high degree of accuracy. Furthermore, even though the delay circuit 7 allows the selecting of the appropriate desired delay time, the area of the chip occupied by the delay circuit can be held to a compact size thus making a major contribution to further increased integration in semiconductor integrated circuit devices.

In addition, even if the delay amount of each of the NAND gates 11 and 12 through 41 and 42 is inconsistent caused by inconsistencies in the production of the semiconductor integrated circuit device, it is possible to mutually nullify these inconsistencies and to suppress any variations in the delay amount.

Note that the remaining basic operation and effects are the same as those in the first embodiment.

Note also that the present invention is not limited to the above first through seventh embodiments and various modifications and improvements are possible provided they fall within the range of the spirit of the present invention.

In the present embodiments, examples in which four sets of individual delayed output terminals or individual delay input terminals are used are described, however, the present invention is not limited to these, and the present invention can also be applied in the same way when the sets consist of two or three or even five or multiple stage connections.

Moreover, in the examples described above, the predetermined delay stages forming the delay section 100 are formed from the inverter gates 101 and 102 through 401 and 402, while the predetermined delay stages forming the delay section 10A are formed from the NAND gates 11 and 12 through 41 and 42, however, it is also possible to form the former from NAND gates or NOR gates and to form the latter from inverter gates or NOR gates. It is also possible to use some other logic inversion gate structure provided it has a logic inversion function. Moreover, in the present embodiments, the predetermined delay stages are formed from two stage logic inversion gates, however, it is possible to use logic inversion gates of four or more stages, provided that there is an even number of stages.

Each predetermined delay stage of the delay sections 100 and 10A has been formed with the same structure, however, it is also possible for a structure to be used in which each stage has a different predetermined delay time.

According to the present invention, by accurately adding a delay time where appropriate to a propagated signal from the input of the signal without causing any waveform deformation or parasitic delay caused by parasitic elements, it is possible to provide a delay circuit, a semiconductor integrated circuit device containing the delay circuit, and a delay method, that enable a delay signal having a predetermined delay time and a delay pulse having a predetermined time width to be accurately and appropriately generated.

What is claimed is:

1. A delay circuit comprising:

a delay section having two or more predetermined delay stages connected in series, each predetermined delay stage adds a predetermined delay time to a signal received by the predetermined delay stage; and two or more selecting switch sections, wherein an input terminal thereof is connected to an output terminal of each predetermined delay stage, each selecting switch section comprises:

a selecting section means for selecting one of output terminals of the predetermined delay stages by control signal to receive a delayed input signal from the output terminal; and a buffer section provided with first and second transistors, wherein the delayed input signal is propagated to each gate of the first and second transistors via the selecting section means, and wherein an output signal from the buffer section has a desired delay time.

2. The delay circuit according to claim 1, wherein the rise and the fall delay time of the predetermined delay time are substantially uniform.

3. The delay circuit according to claim 1, wherein the first transistor is connected between an output terminal outputting the output signal and a first power supply voltage, and the second transistor is connected between the output terminal and a second power supply voltage.

4. The delay circuit according to claim 3, wherein the first power supply voltage is a power supply voltage potential and the first transistor is a PMOS transistor.

5. The delay in circuit according to claim 3, wherein the second power supply voltage is a ground potential and the second transistor is an NMOS transistor.

6. The delay circuit according to claim 1, wherein each gate of the first and second transistors is controlled by a logical gate circuit.

7. A semiconductor integrated circuit device comprising:

a delay section having two or more predetermined delay stages connected in series, each predetermined delay stage adds a predetermined delay time to a signal received by the predetermined delay stage; and two or more selecting switch sections, wherein an input terminal thereof is connected to an output terminal of each predetermined delay stage, each selecting switch sections comprises:

a selecting section means for selecting one of output terminals of the predetermined delay stages by control signal to receive a delayed input signal from the output terminal; and a buffer section provided with first and second transistors, the delayed input signal is propagated to each gate of the first and second transistors via the selecting section means, wherein an output signal from the buffer section has a desired delay time.

* * * * *